United States Patent [19]

Humpal et al.

[11] Patent Number: 5,478,456
[45] Date of Patent: Dec. 26, 1995

[54] SPUTTERING TARGET

[75] Inventors: Kathleen M. Humpal; James P. Mathers, both of Woodbury; Michael B. Hintz, Mahtomedi, all of Minn.

[73] Assignee: Minnesota Mining and Manufacturing Company, St. Paul, Minn.

[21] Appl. No.: 130,367

[22] Filed: Oct. 1, 1993

[51] Int. Cl.$^6$ .................. C23C 14/00; C04B 35/52; C04B 35/50; C04B 35/64
[52] U.S. Cl. .................. 204/192.13; 204/192.12; 501/88; 501/98; 501/152; 264/41; 264/63; 264/65
[58] Field of Search .................. 204/298.12, 298.13, 204/192.15, 192.16, 192.22, 192.23, 192.26, 192.29; 428/694 DE, 694 RE, 694 WF, 694 XS; 501/88, 152, 98; 264/29.6, 41, 63, 65, 501

[56] References Cited

U.S. PATENT DOCUMENTS

| | | | |
|---|---|---|---|
| 2,907,972 | 10/1959 | Schildhauer et al. | 338/332 |
| 3,117,372 | 1/1964 | McNees et al. | 423/266 |
| 4,123,286 | 10/1978 | Coppola et al. | 106/44 |
| 4,124,667 | 11/1978 | Coppola et al. | 264/29.5 |
| 4,135,937 | 1/1979 | Murata et al. | 106/44 |
| 4,135,938 | 1/1979 | Murata et al. | 106/44 |
| 4,144,207 | 3/1979 | Ohnsorg | 260/23 |
| 4,154,787 | 5/1979 | Brown | 264/60 |
| 4,172,109 | 10/1979 | Smoak | 264/65 |
| 4,179,299 | 12/1979 | Coppola et al. | 106/44 |
| 4,207,226 | 6/1980 | Storm | 260/30 |
| 4,237,085 | 12/1980 | Smoak | 264/65 |
| 4,312,954 | 1/1982 | Coppola et al. | 501/90 |
| 4,333,808 | 6/1982 | Bhattacharyya et al. | 204/192 D |
| 4,346,049 | 8/1982 | Coppola et al. | 264/65 |
| 4,525,461 | 6/1985 | Boecker et al. | 501/90 |
| 4,564,490 | 1/1986 | Omori et al. | 264/63 |
| 4,917,970 | 4/1990 | Funkenbusch | 428/694 |
| 4,923,829 | 5/1990 | Yasutomi et al. | 501/98 |
| 5,190,631 | 3/1993 | Windischmann et al. | 204/192.15 |
| 5,232,790 | 8/1993 | Arumine et al. | 204/192.16 |

FOREIGN PATENT DOCUMENTS

| | | | |
|---|---|---|---|
| 2019720A1 | 1/1991 | Canada | G11B 11/10 |
| 3-183765 | 8/1991 | Japan | C23G 14/34 |
| 4-128369 | 4/1992 | Japan | C23C 14/34 |

*Primary Examiner*—R. Bruce Breneman
*Assistant Examiner*—Rodney G. McDonald
*Attorney, Agent, or Firm*—Gary L. Griswold; Walter N. Kirn; Gregory D. Allen

[57] ABSTRACT

Electrically conductive sputtering target comprising yttria and amorphous carbon, a method of making the same, and a method of using the same.

23 Claims, No Drawings

SPUTTERING TARGET

BACKGROUND OF THE INVENTION

1. Field of the Invention

This invention relates to sputtering targets useful, for example, for depositing thin films by DC magnetron sputtering. Such thin films, in turn, can be used in the manufacture of optical recording media, cutting tools, eyeglass lenses, read/write heads for magnetic recording, photovoltaic cells, semiconductors, and automotive and structural glass.

2. Description of the Related Art

Various techniques for physical vapor deposition of thin films are known, including evaporation and various sputtering processes. Commonly employed sputtering processes include diode sputtering and magnetically enhanced sputtering.

In typical sputtering processes an electric field is maintained between an anode and a target cathode within a partial vacuum (i.e., a pressure from about $1 \times 10^{-4}$ to $3 \times 10^{-2}$ torr). A gas such as argon is ionized between the anode and the cathode, forming a plasma. Free electrons in the plasma are accelerated toward the anode, colliding with other gas atoms in their path to further ionize the gas. The gas ions are accelerated to the target cathode and dislodge or sputter atoms by transferring their momentum to the atoms near the surface of the target. The substrate to be coated is placed in proximity to the cathode, and the sputtered atoms traverse the space between the cathode and substrate and condense on the substrate.

In magnetically enhanced sputtering a magnetic field is applied perpendicular to the electric field near the cathode surface. The magnetic field causes electrons in the plasma to follow curved trajectories. A longer (curved) path increases the probability of collision with gas atoms in the chamber. Such collisions produce additional gas ions thereby increasing the sputtering rate.

Another feature of the magnetic enhancement is that electrons are confined near the cathode surface, thereby increasing plasma density in this region. This increase in plasma density enables operation at lower gas pressures and decreases electron bombardment heating of the substrate. The latter feature is particularly important when substrate materials having relatively low melting points are used.

In one type of magnetically enhanced sputtering, known as magnetron sputtering, the electron confinement field is such that a closed torroidal electron trapping path region or "racetrack" is formed adjacent to the sputtering target surface. Magnetron sputtering typically exhibits good sputtering efficiency and is commonly used for thin film deposition.

Magnetron sputter-deposition processes typically operate at discharge voltages of greater than 100 but less than 1000 volts. During normal operation, the discharge current is distributed over a region defined by the magnetic confinement field geometry. One mode of undesirable operation during magnetron sputter deposition is known as arcing. When arcing occurs, the discharge voltage generally decreases and the discharge current becomes localized to a small region of the target surface area.

For the deposition of optical thin films, the occurrence of arcing during sputter deposition processes is typically undesirable. The intense, localized discharge associated with arcing can cause high local deposition rates, local melting of the target surface, spattering of molten material, and cracking or disintegration of the target. Further, in general, frequent arcing during deposition causes numerous defects in the deposited films and substantially reduces target lifetimes.

Magnetron sputtering can be characterized by the power source employed. "DC magnetron sputtering," which utilizes a direct current power source, requires a target having sufficient electrical conductivity to transport the discharge current with an acceptably low voltage drop. Assuming a target current density of 50 mA/cm$^2$, and bearing in mind that an induced through-target voltage drop greater than 50 volts is unacceptable, a maximum target material resistance of 1000 ohm/cm$^2$ is required. For a target thickness of 0.3 cm, the permissible resistivity is approximately 3300 ohm-cm or less.

Another type of magnetron sputtering, known as "RF magnetron sputtering," has also been used to provide sputtered films. RF magnetron sputtering, which uses a radio frequency power source, does not require an electrically conductive sputtering target such as that needed for DC magnetron sputtering.

A variation of magnetron sputtering, called reactive sputtering, has been used to deposit films for which use of a bulk target with the desired film composition has, for example, low electrical or thermal conductivity, and poor mechanical properties, or exhibits low deposition rates. In reactive sputtering, a target containing some of the film constituents is sputtered in an atmosphere containing one or more additional film constituents. Reaction of the sputtered target constituents with the gaseous constituents to form the final (typically, electrically insulating) film composition can then occur either on the substrate surface or in the gas phase. An example of a reactive deposition process is the formation of alumina thin films by sputtering an aluminum target using an Ar-O$_2$ working gas mixture.

SUMMARY OF THE INVENTION

The present invention provides an electrically conductive sputtering target comprising amorphous carbon and at least 35 volume percent (preferably, at least 50 volume percent) yttria (calculated on a theoretical oxide basis as Y$_2$O$_3$), based on the total volume of the target. Preferably, the sputtering target comprises at least about 75 percent (more preferably, at least about 85 percent) by weight yttria, based on the total weight of the sputtering target.

In preferred embodiments, the target further comprises at least one stabilizer. The preferred stabilizer is silicon carbide in an amount no greater than about 30% by volume, based on the total volume of the target. The electrical resistivity of the target preferably is no greater than about 3500 ohm-cm.

Preferably, the target comprises a porous body having a substantially continuous pore network wherein the amorphous carbon is present as a thin coating deposited on surfaces forming the pore network. The thickness of the coating preferably ranges from about 5 to about 200 Å. The amount of amorphous carbon in the target preferably ranges from about 0.40 to about 2.5% by weight, based upon the total weight of the target.

In this application:

"sputtering target" refers to a shaped, three-dimensional body or structure intended for use in a sputtering process as a source material (i.e., a material from which, via sputtering, one or more thin film constituents are provided);

"electrically conductive sputtering target" refers to a sputtering target having an electrical resistivity sufficient for use as a target in DC magnetron sputtering and which exhibits an acceptable arcing level;

"amorphous carbon" means elemental carbon having a diffuse x-ray diffraction pattern without definite lines to indicate the presence of a crystalline component;

"amorphous yttria" means yttria having a diffuse x-ray diffraction pattern without definite lines to indicate the presence of a crystalline component;

"green body" refers to a powder compact which has not been pyrolyzed;

"stabilizer" refers to a material added to the sputtering target that assists in maintaining an amorphous yttria structure in a thin film formed therefrom by a sputtering process;

"substantially continuous pores" refers to interconnected channels that extend substantially throughout the target; and "agglomerate" means a collection of two or more particles held together by relatively weak cohesive forces or organic binder.

Further, "acceptable arc level" as used herein means that the sputtering target exhibits less than one noticeable arc per second averaged over a 10 minute test period under the following conditions. The target is mounted on a planar magnetron cathode with a magnetic field in the plasma confinement region (racetrack) of from 200 Oe to 1000 Oe as measured approximately 5 mm from and parallel to the target surface. The magnetic field is provided by a fixed magnet. The test is conducted in an argon gas atmosphere at a pressure in the range of from 1 mTorr to 5 mTorr (i.e., the optimum pressure to minimize arcing is within this range and is adjusted for each sample). The surface area (i.e., one face) of the test target is 45.6 $cm^2$ (i.e., a 7.6 cm diameter target) and the cathode is driven by a magnetron drive commercially available under the trade designation "MDX 1K DRIVE" from Advanced Energy Industries of Ft. Collins, Colo. The discharge current density is from 1 to 3 $mA/cm^2$. A "noticeable arc" refers to an arc that can be seen by an observer looking at the discharge during the sputtering operation.

In another aspect, the present invention provides a method of preparing an electrically conductive sputtering target, the method comprising the steps of:

a) providing a body that is a pyrolyzed product of a green body comprising a sufficient amount of organic binder and a sufficient amount of yttria particles to provide after step (b) a sputtering target comprising amorphous carbon and at least 35 volume percent (preferably, at least 50 volume percent) yttria, based on the total volume of the target; and b) firing the pyrolyzed product in a nonoxidizing atmosphere to provide an electrically conductive sputtering target according to the present invention.

Preferably, the firing temperature is no greater than about 1650° C.

Preferred organic binders include organic resins selected from the group consisting of phenolic, polyphenylene, polymethylphenylene, coal tar pitch, and combinations thereof The organic binder and amount thereof is preferably chosen to the electrically conductive sputtering target with an amount of amorphous carbon ranging from about 0 40 to about 2.5% by weight, based upon the total weight of the sputtering target.

In yet another aspect, the present invention provides a method of depositing a thin film comprising amorphous yttria onto a substrate, the method comprising the steps of:

(a) providing an electrically conductive sputtering target according to the present invention;

(b) providing a substrate; and (c) sputtering from the target to deposit a thin film comprising amorphous yttria onto at least a portion of the substrate.

The sputtering step is preferably carried out by DC magnetron sputtering.

The present invention provides sputtering targets which can be used as targets in DC magnetron sputtering. Thin films sputtered from preferred sputtering targets according to the present invention typically have good electrical and optical properties. Such films are useful in a variety of applications, including optical recording media. Further, thin films sputtered from sputtering targets according to the present invention can also be useful, for example, as barrier coatings or chemical resistant coatings for the reinforcement material (e.g., whisker fiber, or particle) of a metal matrix composite.

DESCRIPTION OF THE PREFERRED EMBODIMENTS

The yttria of the sputtering target according to the present invention typically is present as a porous structure having a series of interconnecting channels. The amorphous carbon coats the internal surfaces of the pores to provide a substantially continuous carbon coating throughout, rendering the target electrically conductive.

Yttria suitable for preparing the sputtering target according to the present invention preferably is in the form of particles having an average particle size in the range from about 0.5 to about 20 micrometers. With particles below about 0.5 micrometers, it tends to be difficult to achieve suitable density in the green body, while particles above about 20 micrometers tend to be difficult to press into a strong green body. More preferably, the average particle size of the yttria is in the range from about 1 to about 5 micrometers. If the average particle size is much less than about 1 micrometer, a large surface area results which tends to cause excessive outgassing during sputtering. Further, such small particles are also undesirable because they may debond during sputtering and cause arcing when entrained in the plasma. Average particle sizes above about 5 micrometers tend to provide pressed green bodies with strengths that are lower than those with particles up to about 5 micrometers. Suitable yttria powder is commercially available, for example, as product number "5600" from Molycorp, Inc., of White Plains, N.Y.

The preferred source for the amorphous carbon is an organic binder. The binder is typically first dissolved in solvent. The resulting solution is then combined with yttria powder to form a slurry. The slurry can be milled, for example, to provide a uniform dispersion and to reduce the particle size of constituents thereof. Next, the solvent is evaporated from the slurry, leaving a thin coating of the organic material on the powder particles which, upon pyrolysis, forms the amorphous carbon coating.

The organic binder, which also aids in binding the powder together and in making the green body handleable, is chosen to provide a high carbon yield upon pyrolysis. Suitable organic binders include polymeric materials such as polyphenylene, phenolics, polymethylphenylene, and coal tar pitch.

Preferred polymeric binders are soluble in ethanol or water. Such organic binders include phenolic resins such as those commercially available under the trade designations "DUREZ 7031A" and "DUREZ 14798" from Occidental Chemical Corporation, DUREZ Division, of Dallas, Tex., and "BKUA" from Union Carbide of Danbury, Conn.

A stabilizer can be included with the yttria and carbon source to help maintain the yttria in the thin film formed by sputtering as an amorphous phase following the sputtering operation. Examples of suitable stabilizers include silicon carbide, silicon, GeFeCo, TbFeCo, $Al_2O_3$, $HfO_2$, $ZrO_2$, and $TiO_2$. Further, the amorphous carbon may act as a stabilizer.

The preferred stabilizer is silicon carbide. Preferably, the silicon carbide stabilizing material has an average particle size in the range of about 0.5 to about 20 micrometers. More preferably, the average particle size of the silicon carbide is in the range from about 0.5 to about 5 micrometers. If the average particle size is much less than about 0.5 micrometer, a large surface area results which tends to cause excessive outgassing during sputtering. Further, such small particles are also undesirable because they may debond during sputtering and cause arcing when entrained in the plasma. Average particle sizes above about 5 micrometers tend to provide pressed green bodies with strengths that are lower than those with particles up to about 5 micrometers. Suitable silicon carbide is commercially available, for example, under the trade designation "CARBOGRAN UF-15" from Lonza, Ltd., of Basel, Switzerland. The amount of silicon carbide preferably is no greater than about 30% by volume, based on the total volume of the target.

The yttria and carbon source can further comprise a plasticizer. Suitable plasticizers include glycerol, butyl stearate, and dimethyl phthalate, which are available, for example, from Mallinckrodt of Paris, Ky., and J. T. Baker Chemical Co. of Phillipsburg, N.J.

The yttria, carbon precursor, and optional additives (e.g., stabilizer and/or plasticizer) can be blended together using conventional techniques such as ball milling. Ball milling can also be used to reduce the particle size of powders to the desired range. Preferably, the materials are ball milled together in the presence of a solvent (e.g., water or ethanol). The solvent, if present, can be removed from the slurry, for example, by evaporation with continuous stirring or by spray drying. If the solvent is removed by evaporation, the dried powder cake is subsequently broken up into small agglomerates suitable for forming into the desired shape. This can be accomplished, for example, by crushing the powder cake with a mortar and pestle, then screening. If the desired target is formed by dry-pressing, the crushed material is preferably screened through a 60 mesh (250 micrometer) sieve.

The desired size, thickness, and shape of the sputtering target depends on the requirements of the sputtering equipment which is to be used with the target. Other factors to consider in choosing the dimensions of the target include (1) the ability to minimize warpage during firing, (2) the electrical power density at the surface of the target, and (3) the thermal conductivity of the target material.

The yttria, carbon precursor, and optional additives can be formed into the desired shape using conventional techniques. Typically, the sputtering target is formed by dry-pressing the crushed material described above to form a green body, heating the green body to a temperature for a time sufficient to pyrolyze the organic binder, and then firing the pyrolyzed body in a non-oxidizing (e.g., argon or nitrogen) atmosphere for a time sufficient to provide the electrically conductive sputtering target according to the present invention. The firing temperature is typically in the range from about 1000° C. to about 1650° C.

The amorphous carbon is present from about 0.40 to about 2.5 percent (more preferably, about 0.5 to about 2.0 percent) by weight. The lower amounts of amorphous carbon are typically preferred in instances where the optical and/or electrical properties of a film formed by sputtering the target are adversely affected by excess carbon.

Firing of the pyrolyzed body is typically necessary to increase the bond strength between the powder particles. The firing temperature is sufficient to provide as much bonding between particles as possible, without causing the conductive carbon network to break down. Generally, higher firing temperatures lead to increased bonding and sintering. Excessive firing temperatures, however, can lead to reactions between carbon and the other components, resulting in the formation of undesirable phases.

Another factor to consider in firing the pyrolyzed material is residual oxygen in the furnace atmosphere, which tends to cause formation of a carbon deficient layer(s) on the outer surface of the target. The use of graphite flake packing material, such as that commercially available under the trade designation "2900-RG" from Superior Graphite Company of Chicago, Ill. tends to be very effective in minimizing the formation of a carbon deficient layer(s) on the surface of the target during firing.

The fired targets are machineable to the exact dimensions needed. Ultrasonic cleaning is useful for removing loose powder embedded in the surface during machining. Preferably, the final targets are cleaned prior to use as sputtering targets to reduce initial arcing.

Preferably, sputtering targets according to the present invention have a density in the range from about 45 to about 70 percent of theoretical, more preferably, in the range from about 50 to about 65 percent of theoretical.

Freshly prepared targets tend to arc. New or freshly prepared targets are preferably conditioned for at least 10 minutes by sputtering at an amperage of at least 1 $mA/cm^2$, for example, under "test conditions" described in the "Summary of the Invention."

The electrical resistivity of sputtering targets according to the present invention preferably is no greater than about 3500 ohm-cm (more preferably, no greater than about 100 ohm-cm). The electrical resistivity of a target can be measured as follows. The target is ground to remove the outermost layer, which may be carbon deficient due to oxidation during processing. Absorbed water from the grinding process is removed by drying the target in an oven at about 40°–60° C. overnight. The dried target is then placed between sheets of aluminum foil and clamped down with sufficient pressure to insure good contact, but being careful to avoid sufficient pressure to cause the disc to crack. The leads of a volt-ohm-meter or ohm-meter (e.g., a Keithley Model 197 Autoranging Microvolt DMMC Digital Multimeter) are attached to the aluminum contacts using alligator clips. The electrical resistance of the target is then measured and the electrical resistivity calculated using the following equation:

$$\rho = RA/L,$$

wherein $\rho$=resistivity, ohm-cm;

R=resistance, ohm;

A=area of the disc, $cm^2$; and

L=thickness of the disc, cm.

Sputtering targets according to the present invention are useful for depositing thin films onto substrates. The target can be sputtered onto a wide variety of materials which should be apparent to those skilled in the art. Such materials should be compatible with a vacuum system (i.e., materials that exhibit significant outgassing or that evaporate under vacuum are not suitable). For optical recording media, the substrate should be nonmagnetic and dimensionally stable.

Preferred substrate materials for the preparation of optical recording media include polycarbonate, polymethylmethacrylate (PMMA), and glass. For other applications, semiconductors, insulators (e.g., glass, spinel, quartz, sapphire, aluminum oxide), or metals (e.g., aluminum and copper) may be useful. Glass is preferred for applications requiring high dimensional stability, while polymers are preferred for mass production due to their comparatively lower cost.

The use of a sputtering target according to the present invention for preparing dielectric films for magneto-optic recording media is described in assignee's copending application entitled "Amorphous Rare Earth Oxides," having U.S. Ser. No. 08/130,294, filed the same date as the present application, the disclosure of which is incorporated herein by reference for its teaching of using a sputtering target according to the present invention for preparing dielectric films for magneto-optic recording media.

Objects and advantages of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

Examples 1–6

Examples 1–6 illustrate the influence of firing temperature on target resistivity.

Target discs were prepared as follows. About 157.50 grams of yttria (average particle size of 5.0 micrometers; available as product number "5600" from Molycorp, Inc. of White Plains, N.Y.), about 17.50 grams of silicon carbide (average particle size of 0.7 micrometer; available under the trade designation "CARBOGRAN UF-15" from Lonza, Ltd. of Basel, Switzerland), about 8.32 grams of phenolic resin (available under the trade designation "DUREZ 7031A" from Occidental Chemical Corp., DUREZ division, of Dallas, Tex.), and about 8.32 grams of anhydrous glycerol (available as product number "2136" from J. T. Baker Chemical Co. of Phillipsburg, N.J.) were ball milled together in ethanol for about 1 hour at about 96 rpm using a 1 liter polyethylene jar and about 1200 grams of high-alumina media (6.4 mm rods commercially available under the trade designation "BURUNDUM" from Norton Company of Akron, Ohio).

After milling, the ethanol was evaporated over low heat. The slurry was stirred continuously until a soft mud was formed and then stirred occasionally by hand until all the ethanol evaporated. The resulting material was gently crushed and passed through a 60 mesh (250 micrometer) sieve. Four 1 gram discs were pressed from this powder at about 75 MPa (10,700 psi (2100 lbs./0.5 in. diameter die)). The discs were designated Examples 1, 2, 3, and 4, respectively. The phenolic binder was pyrolyzed in a nitrogen atmosphere as follows:

| 20° C. | 120 min. |
| 20° C.→600° C. | 180 min. |
| 600° C. | 60 min. |
| 600° C.→20° C. | 180 min. |

The pyrolyzed discs were then fired to increase bond strength. An argon atmosphere was used for firing. The discs were placed in a graphite crucible equipped with a graphite lid during firing and were surrounded with graphite flake packing material commercially available under the trade designation "2900-RG" from Superior Graphite Co. of Chicago, Ill. The firing schedule for Example 1 was as follows:

| 20° C.→1000° C. | 35 min. |
| 1000° C.→1850° C. | 10° C./min. |
| 1850° C. | 60 min. |
| Furnace Cool | 120 min. |

Following firing, Example 1 appeared to have reacted with the graphite packing material to form a deformed outer surface which was glassy and porous. The disc was not suitable for use as a sputtering target because it was badly deformed.

The firing schedule for Examples 2, 3, and 4 was as follows, with X being 1760° C. 1655° C. and 1545° C., respectively:

| 20° C.→1000° C. | 15 min. |
| 1000° C.→X° C. | 20° C./min. |
| X° C. | 60 min. |
| Furnace Cool | 180 min. |

Two additional discs, designated Examples 5 and 6, were pressed and fired at 1760° C. and 1850° C., respectively, as described above.

The Example 6 disc was distorted. Further, graphite packing material was adhered to the disc.

The diameter and thickness of the discs for Examples 2–5 were each about 1.3 cm (0.5 inch) and about 0.3 cm (0.1 inch), respectively. The outer surfaces of the fired discs for Examples 2–5 were ground off in order to remove any carbon-deficient layers. These discs were then dried to remove any water absorbed during grinding by heating in an oven at about 65° C. for about 3 hours. The electrical resistance of the discs for Examples 2–5 were measured using the procedure described above and their resistivities calculated. The post-pyrolysis and post-firing densities of the discs are given in Table 1, below.

TABLE 1

| EX. | Post-pyrolysis density, % of theoretical | Post-firing density, % of theoretical | Firing temperature, °C. | Resistivity, ohm-cm |
| --- | --- | --- | --- | --- |
| 2 | 50.1 | 75.5 | 1760 | $43 \times 10^6$ |
| 3 | 49.9 | 67.0 | 1655 | 15.6 |
| 4 | 49.7 | 54.9 | 1545 | 2.4 |
| 5 | 51.6 | 84.9 | 1760 | 1151 |
| 6 | 51.6 | — | 1850 | — |

X-ray diffraction data were collected for Examples 3, 5, and 6 in the form of survey scans employing a vertical diffractometer, diffracted beam monochrometer, copper K-alpha radiation, and proportional detector registry of the scattered radiation (equipment available from Philips Electronic Instruments Co. of Mahwah, N.J.). The faces of the discs for Examples 3, 5, and 6 were ground to remove any reacted layer(s) (i.e., reaction with the graphite packing material) and/or carbon deficient layer(s) present on the faces prior to the x-ray analysis. The relative intensities of the phases detected for each Example are presented in Table 2, below.

TABLE 2

| Ex. | $Y_2O_3$ | SiC | "YOC"* | Y | $Y_2Si_2O_7$ | $Y_2SiO_5$ | Firing temp., °C. |
|---|---|---|---|---|---|---|---|
| 3 | 100 | 3 | 0 | 0 | 0 | 1 | 1655 |
| 5 | 100 | 4 | 0 | 0 | 0 | 3 | 1760 |
| 6 | 100 | 40 | 10 | 5 | 2 | 0 | 1850 |

*YOC denotes all possible phases of yttrium oxycarbide.

The $Y_2O_3$—$SiO_2$ phase diagram shows a liquid phase to be present in the $Y_2Si_2O_7$ composition at 1850° C., which is consistent with the results observed.

The results for Example 3 (fired at 1655° C.) were similar to those for Example 5 except less yttrium silicate phase was present.

The results for Example 5 (fired at 1760° C.) show the presence of yttria and silicon carbide, as well as an unidentified phase. The lines for the unidentified phase are similar, but not identical, to that for some of the yttrium silicates. The unidentified phase is reported in Table 2 as $Y_2SiO_5$.

The results for Example 6 (fired at 1850° C.) show some of the yttria, silicon carbide, and carbon reacted to form phases of $Y_2Si_2O_7$, "YOC" and Y.

The above results suggest that if the firing temperature is too high, the yttria, silicon carbide, and carbon react to form new phases. Such phases are believed to impair the continuous conduction provided by the amorphous carbon. If the firing temperature is too low, however, there is poor bonding of the particles and the targets display arcing and excessive outgassing when sputtered, which is typically at a level that is undesirable for producing high quality optical thin films.

Auger analysis of fresh fracture surfaces of the discs fired at 1545° C. (Example 4), 1655° C. (Example 3), and 1760° C. (Example 5) was done to determine the approximate thickness of the carbon on the surface of the yttria and silicon carbide. The Auger results showed that the carbon thickness is in the range of 10 to 200Å.

Example 7

About 157.50 grams of yttria ("5600"), about 17.50 grams of silicon carbide ("CARBOGRAN UF-15"), about 8.32 grams of phenolic resin ("DUREZ 7031A"), and about 8.32 grams of anhydrous glycerol ("2136") were ball milled together in ethanol for about 1 hour at about 96 rpm using a 1 liter polyethylene jar and about 1200 grams of high-alumina media (6.4 mm rods; "BURUNDUM").

After milling, the ethanol was evaporated over low heat. The slurry was stirred continuously until a soft mud was formed and then stirred occasionally by hand until all the ethanol had evaporated. The resulting powder was gently crushed and passed through a 60 mesh (250 micrometer) sieve. A disc was pressed from about 130 g of this powder at 75 MPa (10,700 psi (60 tons/3.75 in. diameter die)).

The disc was fired in a nitrogen atmosphere according to the following firing schedule:

| | |
|---|---|
| 20° C. | 120 min |
| 20° C.→1000° C. | 600 min. |
| 1000° C. | 60 min. |
| 1000° C.→20° C. | 300 min. |

The pre-pyrolysis and post-firing densities for this disc were about 51.0% and about 52.5%, respectively, of theoretical.

After firing, the disc was ground to a diameter of less than 7.6 cm (3 inches) and a thickness of less than 0.63 cm (0.25 inch) using a 45 micrometer diamond disc, and then placed in a 65° C. drying oven overnight to remove any water absorbed during grinding. The dried disc was then tested for use as a DC magnetron sputtering target ($1\times10^{-3}$ torr argon, DC power supply, approximately 4 watts/cm$^2$ power density (1.5 mA/cm$^2$)) but exhibited arcing at a level that is typically undesirable for the production of high quality optical thin films. It is believed that this arcing was caused by weakly bonded particles debonding and becoming entrained in the plasma.

Example 8

Example 8 illustrates the preparation of a conductive target comprising yttria + 10% by weight silicon carbide (based upon the combined weight of yttria and silicon carbide and corresponding to 14.8% by volume).

The powder and green disc were prepared as described for Example 7. Before pressing, the die was coated with a 1:1 solution of oleic acid in OMS (odorless mineral spirits) to reduce friction between the part and die when the part was ejected. The phenolic binder was burned out in a nitrogen atmosphere according to the following schedule:

| | |
|---|---|
| 20° C. | 120 min. |
| 20° C.→600° C. | 180 min. |
| 600° C. | 60 min. |
| 600° C.→20° C. | 180 min. |

The disc was placed in a graphite crucible (equipped with a graphite lid), packed in graphite flake packing material, and fired in an argon atmosphere at about 1631° C. according to the following schedule:

| | |
|---|---|
| 20° C.→1000° C. | 60 min. |
| 1000° C.→1631° C. | 5° C./min. |
| 1631° C. | 60 min. |
| Furnace Cool | 180 min. |

The relative post-pyrolysis and post-firing densities are about 53.5% and about 60.2%, respectively.

After firing, the disc was ground flat on both faces and then ground to a diameter of less than 7.6 cm (3 in.) using a 45 micrometer diamond disc on a grinding wheel. The disc was placed into a 65° C. drying oven overnight to remove the water absorbed during grinding. The disc was conditioned by sputtering for 10 minutes at $1\times10^0$ torr argon with a DC power supply (available under the trade designation "MDX 1K DRIVE" from Advanced Energy Industries of Fort Collins, Colo.) at 2.5 mA/cm$^2$. The disc was then tested as a DC Magnetron sputtering target. This disc sputtered very well when tested and arced briefly at the beginning of the run. It is believed that increasing the firing temperature increased the bond strength between the particles.

For magneto-optic media, the desired values for a dielectric film are an index of refraction between 1.7 and 3.0; and an index of absorption as low as possible, but at least below 0.15. At higher index of absorption values, there is insufficient signal from the magneto-optic media. The optical properties of the sputtered film prepared using the target of Example 8 were evaluated at a wavelength of 830 nm which is the wavelength used for laser reading and writing of optical discs. The index of refraction, n, was 1.94. The index of absorption, k, was less than or equal to 0.01.

Examples 9–12

Examples 9–12 illustrate samples having selected amounts of carbon.

The samples formulations used for Examples 9–12 are listed in Table 3, below. Comparative Example A, having 0.08 weight percent in carbon, is also listed in Table 3.

TABLE 3

| Ex. | $Y_2O_3$, g | SiC, g | Phenolic resin, g | Glycerol, g | PEG, g | Carbon, wt. % |
|---|---|---|---|---|---|---|
| 9 | 11.03 | 1.22 | 0.45 | 0.58 | 0.13 | 1.29 |
| 10 | 11.03 | 1.22 | 0.34 | 0.58 | 0.24 | 0.97 |
| 11 | 11.03 | 1.22 | 0.25 | 0.58 | 0.33 | 0.71 |
| 12 | 11.03 | 1.22 | 0.14 | 0.58 | 0.44 | 0.41 |
| Comp. A | 11.03 | 1.22 | 0.03 | 0.58 | 0.55 | 0.08 |

The carbon weight percent values are based on the assumption that the phenolic resin provides approximately 35.3 wt. % carbon upon pyrolysis. This was calculated by heating a sample prepared as described in Example 8 in air according to the following schedule.

| | |
|---|---|
| RT→600° C. | 180 min. |
| 600° C. | 60 min. |
| 600° C.→RT | 60 min. |

The sample was cooled to room temperature before weighing. The weight of the part was recorded before and after heating. The weight loss with heating corresponds to the amount of carbon in the sample.

Examples 9–12 were each prepared by dissolving phenolic resin ("DUREZ 7031A"), glycerol (commercially available from Mallinckrodt of Paris, Ky.), and polyethylene glycol (commercially available under the trade designation "COMPOUND 20M FLAKED" from Union Carbide of Danbury, Conn.) in about 50 grams of ethanol. Yttria ("5600") and silicon carbide ("CARBOGRAN UF-15") were then added to the resulting solution. The resulting slurry was sonicated for 10 minutes. The ethanol was evaporated from the slurry by heating at about 30° C. with continuous stirring until a soft mud was formed. Heating was continued with occasional stirring by hand until the ethanol had evaporated.

The resulting powder for each example was gently crushed and passed through a 60 mesh sieve. Two gram discs were pressed from each powder at about 75 MPa (10,700 psi (2100 lbs./0.5 in. diameter die)). A disc was also prepared from powder prepared as described in Example 7. The latter disc is designated Example 13. The discs were pyrolyzed in a nitrogen atmosphere as follows:

| | |
|---|---|
| 20° C. | 120 min. |
| 20° C.→600° C. | 180 min. |
| 600° C. | 60 min. |
| 600° C.→20° C. | 180 min. |

The post-pyrolysis density values for each example are set forth in Table 4, below.

The above discs were buried in graphite flake and then fired in a graphite crucible with a graphite lid in an argon atmosphere according to the following firing schedule:

| | |
|---|---|
| 20° C.→1000° C. | 15 min. |
| 1000° C.→1665° C. | 20° C./min. |
| 1665° C. | 60 min. |
| Furnace Cool | 180 min. |

The post-firing densities are set forth in Table 4, below.

TABLE 4

| Ex. | Post-pyrolysis density, % of theor. | Post-firing density, % of theor. | Resistivity, ohm-cm | Carbon, wt. % |
|---|---|---|---|---|
| Comp. A | 50.6 | 64.6 | $1.95 \times 10^6$ | 0.08 |
| 9 | 50.9 | 63.7 | 12.9 | 1.29 |
| 10 | 51.7 | 64.2 | 1.52 | 0.97 |
| 11 | 51.7 | 64.7 | 1.42 | 0.71 |
| 12 | 51.2 | 64.3 | 1.30 | 0.41 |
| 13 | 52.4 | 65.8 | 1.13 | 1.65 |

The outer surface of each disc was ground off to remove carbon-deficient layers and the discs were dried to remove water absorbed during grinding. The faces were sputter coated with 20 nm of gold to produce better contact with the electrodes during the resistance measurement. The resistance of each disc was measured and the resistivity was calculated. The results are set forth in Table 4, above.

These results of this experiment show that a carbon content of as low as about 0.4 weight percent can provide a target having sufficient conductivity for use in DC magnetron sputtering.

Example 14

Example 14 illustrates the preparation of an electrically conductive target comprising yttria.

About 175.00 grams of yttria ("5600"), about 11.88 grams of phenolic resin (available under the trade designation "DUREZ 14798" from Occidental Chemical Corp., DUREZ division), and about 8.32 grams of glycerol (available from Mallinckrodt of Paris, Ky.) were ball milled together in water for about 1 hour at about 86 rpm using a 1 liter polyethylene jar and about 1200 grams of high-alumina media (6.4 mm rods; "BURUNDUM"). Before milling the glycerol and phenolic resin were dissolved in the water.

Three batches were prepared as described above. The separately prepared lots were combined and processed in a 0.91 meter (3 foot) diameter spray dryer commercially available under the trade designation "MOBILE MINOR SPRAY DRYER" (Basic Model) from Niro Inc. of Columbia, Md.). The slurry was sprayed using a 24-hold wheel atomizer and run at about 12,000 rpm. The spray dryer input temperature was set at about 145° C. The output temperature was about 65° C.

About 128 grams of the resulting powder was used to press a disc at about 75 MPa (10,700 psi (60 tons/3.75 in. diameter die)).

The disc was pyrolyzed in a nitrogen atmosphere as follows:

| | |
|---|---|
| 20° C. | 240 min. |
| 20° C.→600° C. | 180 min. |
| 600° C. | 60 min. |
| 600° C.→20° C. | 180 min. |

The pyrolyzed disc was then loaded into a graphite crucible equipped with a graphite lid, buried in graphite flake packing material ("2900-RG"), and fired at about 1642° C. in an argon atmosphere according to the following firing schedule:

| | |
|---|---|
| 20° C.→1000° C. | 60 min. |
| 1000° C.→1642° C. | 5° C./min. |
| 1642° C. | 60 min. |
| Furnace Cool | 180 min. |

The post-pyrolysis and post-firing densities were about 50.6% and about 59.3%, respectively, of theoretical.

Following firing, the outer surface of the disc was ground off to remove any carbon-deficient layers that may have formed. The disc was placed in a 40° C. drying oven overnight to remove any water that had been absorbed during grinding. The electrical resistivity was determined as described in Examples 2–6 to be about 4.11 ohm-cm.

This disc was used as a DC magnetron sputtering target to successfully produce an amorphous dielectric film. Prior to sputtering to produce the dielectric thin film, the disc was "conditioned" by sputtering for 10 minutes at $1 \times 10^{-3}$ torr argon with the DC power supply ("MDX 1K DRIVE") at 2.5 mA/cm$^2$. The optical properties were measured at a wavelength of 830 nm. The index of refraction, n, had an average value of 1.91. The index of absorption, k, had an average value of 0.006.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. An electrically conductive sputtering target comprising (a) at least 35 volume percent yttria, based on the total volume of the target, present as a porous structure having a series of interconnecting channels, and (b) a substantially continuous amorphous carbon coating on internal surfaces of said porous structure such that said target is electrically conductive.

2. The sputtering target of claim 1 comprising at least about 75 percent by weight of said yttria, based on the total weight of said sputtering target.

3. The sputtering target of claim 1 further comprising at least one stabilizer.

4. The sputtering target of claim 1 further comprising silicon carbide as a stabilizer.

5. The sputtering target of claim 1 wherein said silicon carbide is present in an amount no greater than about 30% by volume, based on the total volume of said sputtering target.

6. The sputtering target of claim 1 wherein said amorphous carbon coating has a thickness in the range from about 5 to about 200 Å.

7. The sputtering target of claim 1 wherein said amorphous carbon is present in the range from about 0.40 to about 2.5% by weight, based upon total weight of said target.

8. The sputtering target of claim 1, having an electrical resistivity no greater than about 3500 ohm-cm.

9. A method of preparing an electrically conductive sputtering target, the method comprising the steps of:

a) providing a green body comprising a sufficient amount of organic binder and a sufficient amount of yttria particles to provide after steps (b) and (c) an electrically conductive sputtering target comprising amorphous carbon and at least 35 volume percent yttria, based on the total volume of the target;

b) pyrolyzing said green body to provide a pyrolyzed product; and c) firing said pyrolyzed product in a nonoxidizing atmosphere to provide an electrically conductive sputtering target comprising (i) at least 35 volume percent yttria, based on the total volume of the target, present as a porous structure having a series of interconnecting channels, and (ii) a substantially continuous amorphous carbon coating on internal surfaces of said porous structure such that said target is electrically conductive.

10. The method of claim 9, wherein said green body comprises a sufficient amount of said yttria particles to provide after step (b) an electrically conductive sputtering target comprising at least about 75 percent by weight yttria, based on the total weight of said target.

11. The method of claim 10 wherein said firing is conducted at a temperature no greater than about 1650° C.

12. The method of claim 10 wherein said organic binder is an organic resin selected from the group consisting of phenolic, polyphenylene, polymethylphenylene, coal tar pitch, and combinations thereof.

13. The method of claim 10 wherein said green body further comprises at least one stabilizer.

14. The method of claim 10 wherein said green body further comprises a stabilizer which is silicon carbide.

15. The method of claim 10 wherein said organic binder is present in an amount sufficient to provide after steps (b) and (c) said electrically conductive sputtering target with amorphous carbon in an amount from about 0.40 to about 2.5% by weight, based upon total weight of said target.

16. The method of claim 10 wherein said target has an electrical resistivity no greater than about 3500 ohm-cm.

17. An electrically conductive sputtering target comprising a substantially continuous pore network of yttria and a substantially continuous amorphous carbon coating on internal surfaces of said pore network such that said target is electrically conductive, said target comprising at least 35 volume percent yttria, based on the total volume of said target.

18. The sputtering target of claim 17, comprising at least about 75 percent by weight of said yttria, based on the total weight of said sputtering target.

19. The sputtering target of claim 17 further comprising at least one stabilizer.

20. The sputtering target of claim 17 further comprising silicon carbide as a stabilizer.

21. The sputtering target of claim 20 wherein said silicon carbide is present in an amount no greater than about 30% by volume, based on the total volume of said sputtering target.

22. The sputtering target of claim 17 wherein said amorphous carbon coating has a thickness in the range from about 5 to about 200 Å.

23. The sputtering target of claim 17 wherein said amorphous carbon is present in the range from about 0.40 to about 2.5% by weight, based upon total weight of said target.

* * * * *

UNITED STATES PATENT AND TRADEMARK OFFICE
CERTIFICATE OF CORRECTION

PATENT NO. : 5,478,456
DATED : December 26, 1995
INVENTOR(S) : Humpal et al.

It is certified that error appears in the above-identified patent and that said Letters Patent is hereby corrected as shown below:

On the Title page, item [56]:
In the Reference Cited section, please change "Arumine et al." to --Arimune et al.--

In column 7, line 50, please change "i" to --1--

In column 10, line 52, please change "1X10*" to --1X10$^{-3}$--

In column 13, line 58, please change "1" to --4--

Signed and Sealed this

Twenty-fifth Day of November, 1997

Attest:

BRUCE LEHMAN

Attesting Officer

Commissioner of Patents and Trademarks